(12) United States Patent
Lin et al.

(10) Patent No.: US 10,593,822 B2
(45) Date of Patent: Mar. 17, 2020

(54) MAIN-GATE-FREE AND HIGH-EFFICIENCY BACK-CONTACT SOLAR CELL MODULE, MAIN-GATE-FREE AND HIGH-EFFICIENCY BACK-CONTACT SOLAR CELL ASSEMBLY, AND PREPARATION PROCESS THEREOF

(71) Applicant: Jolywood (Suzhou) Sunwatt Co., Ltd., Jiangsu (CN)

(72) Inventors: Jianwei Lin, Jiangsu (CN); Wenjin Xia, Jiangsu (CN); Yuhai Sun, Jiangsu (CN); Yuzheng Zhang, Jiangsu (CN)

(73) Assignee: Jolywood (Suzhou) Sunwatt Co., Ltd., ShajiabangTown Changshu (CN)

( * ) Notice: Subject to any disclaimer, the term of this patent is extended or adjusted under 35 U.S.C. 154(b) by 0 days.

(21) Appl. No.: 15/514,553
(22) PCT Filed: Mar. 23, 2015
(86) PCT No.: PCT/CN2015/000198
§ 371 (c)(1),
(2) Date: Mar. 27, 2017
(87) PCT Pub. No.: WO2016/045227
PCT Pub. Date: Mar. 31, 2016

(65) Prior Publication Data
US 2017/0222082 A1 Aug. 3, 2017

(30) Foreign Application Priority Data
Sep. 28, 2014 (CN) .......................... 2014 1 0509847

(51) Int. Cl.
*H01L 31/05* (2014.01)
*H01L 31/048* (2014.01)
(Continued)

(52) U.S. Cl.
CPC ...... *H01L 31/0516* (2013.01); *H01L 31/0201* (2013.01); *H01L 31/02167* (2013.01);
(Continued)

(58) Field of Classification Search
CPC ......... H01L 31/0516; H01L 31/022441; H01L 31/022458; H01L 31/0201;
(Continued)

(56) References Cited

U.S. PATENT DOCUMENTS

| 5,641,362 A | * | 6/1997 | Meier | ............. | H01L 31/022441 |
| | | | | | 136/256 |
| 7,339,110 B1 | * | 3/2008 | Mulligan | ........ | H01L 31/022441 |
| | | | | | 136/256 |

(Continued)

FOREIGN PATENT DOCUMENTS

| CN | 102544167 A | 7/2012 |
| CN | 102709337 A | 10/2012 |

(Continued)

*Primary Examiner* — Golam Mowla
(74) *Attorney, Agent, or Firm* — Edwin A. Sisson, Attorney at Law, LLC

(57) ABSTRACT

The present invention relates to the field of solar cells, and in particular to a main-gate-free and high-efficiency back-contact solar cell module, a main-gate-free and high-efficiency back-contact solar cell assembly, and a preparation process thereof. The solar cell module, comprising cells and an electrical connection layer, a backlight side of the cells having P-electrodes connected to a P-type doping layer and N-electrodes connected to a N-type doping layer, is characterized in that the electrical connection layer comprises a number of parallel leads each electrically connected to the P-electrodes or the N-electrodes. The present invention has the beneficial effect that a main-gate-free and high-efficiency back-contact solar cell module, a main-gate-free and high-efficiency back-contact solar cell assembly, and a preparation process thereof are provided, which can effectively the short-circuiting of the P-electrodes and the N-electrodes and has the advantages of low cost, high hidden-cracking resistance, high efficiency and high stability.

22 Claims, 5 Drawing Sheets

3a

3b

(51) Int. Cl.
*H01L 31/0216* (2014.01)
*H01L 31/0224* (2006.01)
*H01L 31/18* (2006.01)
*H01L 31/02* (2006.01)

(52) U.S. Cl.
CPC .. *H01L 31/022441* (2013.01); *H01L 31/0481* (2013.01); *H01L 31/0512* (2013.01); *H01L 31/1864* (2013.01); *H01L 31/1876* (2013.01); *Y02E 10/50* (2013.01); *Y02P 70/521* (2015.11)

(58) Field of Classification Search
CPC ........... H01L 31/02167; H01L 31/0512; H01L 31/0481; H01L 31/1864; H01L 31/1876; Y02E 10/50; Y02P 70/521
USPC ........................................................ 136/244
See application file for complete search history.

(56) References Cited

U.S. PATENT DOCUMENTS

| | | | | |
|---|---|---|---|---|
| 2008/0121266 A1* | 5/2008 | Tsunomura | ......... | H01L 31/0747 136/244 |
| 2008/0276981 A1* | 11/2008 | Kinoshita | ....... | H01L 31/022425 136/244 |
| 2009/0272419 A1* | 11/2009 | Sakamoto | ......... | H01L 31/02168 136/244 |
| 2010/0051085 A1* | 3/2010 | Weidman | ........ | H01L 31/022441 136/244 |
| 2010/0126551 A1* | 5/2010 | Okamoto | ........ | H01L 31/022425 136/244 |
| 2011/0030759 A1* | 2/2011 | Funakoshi | ...... | H01L 31/022441 136/244 |
| 2011/0272006 A1* | 11/2011 | Sainoo | .................. | H01L 31/048 136/251 |
| 2012/0279546 A1* | 11/2012 | Kutzer | ........... | H01L 31/022441 136/244 |
| 2014/0338747 A1* | 11/2014 | Choi | ............... | H01L 31/022441 136/258 |
| 2016/0284895 A1* | 9/2016 | Hashimoto | ..... | H01L 31/022425 |

FOREIGN PATENT DOCUMENTS

| | | |
|---|---|---|
| CN | 102723380 A | 10/2012 |
| CN | 102769059 A | 11/2012 |
| CN | 202712197 U | 1/2013 |
| CN | 104064608 A | 9/2014 |
| CN | 104282788 A | 1/2015 |
| CN | 204088345 U | 1/2015 |
| CN | 204144285 U | 2/2015 |

* cited by examiner 3a 3b

MAIN-GATE-FREE AND HIGH-EFFICIENCY BACK-CONTACT SOLAR CELL MODULE, MAIN-GATE-FREE AND HIGH-EFFICIENCY BACK-CONTACT SOLAR CELL ASSEMBLY, AND PREPARATION PROCESS THEREOF

PRIORITIES AND CROSS REFERENCES

This application claims priority from International Patent Application No. PCT/CN2015/000198 filed on 23 Mar. 2015 and Chinese Patent Application No. 201410509847.2 filed on 28 Sep. 2014, the teachings of each of which are hereby incorporated by reference in their entirety.

TECHNICAL FIELD

The present invention relates to the field of solar cells, and in particular to a main-gate-free and high-efficiency back-contact solar cell module, a main-gate-free and high-efficiency back-contact solar cell assembly, and a preparation process thereof.

BACKGROUND OF THE PRESENT INVENTION

Energy is the material basis of human activities. With the continuous development and progress of society, the demand for energy is increasing. The traditional fossil energy, belonging to non-renewable energy, has been difficult to meet the demands of the social development. Therefore, in recent years, new energy and renewable energy have been widely researched and utilized in countries all over the world. Among others, the solar power generation technology has attracted much attention due to its advantages of capability of converting sunlight into electric power, easy operation, environmental protection and no pollution, and high energy utilization. Solar power generation is a process of power generation in which large-area P-N junction diodes are used to produce photon-generated carries under the radiation of sunlight.

In the prior art, for dominant and highly commercial crystalline silicon solar cells, the emitter region and electrodes in the emitter region are all on the front side (light-facing side) of the cell. That is, the main gate line and the auxiliary gate line are both on the front side of the cell. Since solar-grade silicon material has a short diffusion distance, placing the emitter region on the front side is helpful for improving the collection efficiency of carriers. However, since the gate lines on the front side of the cell shield part of sunlight (about 8%), the effective light-receiving area of the solar cell is reduced and part of current is thus lost. In addition, when cells are connected in series to each other, a tin-plated copper band is to be welded from the front side of one cell to the back side of another cell. If a thick tin-plated copper band is used, it may be possible to crack the cell because of its excessive hardness. However, if a thin but wide tin-plated copper band is used, much sunlight may be shielded. Therefore, the loss resulted from the serial connection of resistors and the optical loss will be caused regardless of the type of the tin-plated copper band used. Also, the use of the tin-plated copper band is disadvantageous to the thinning of the cell. To solve the above technical problems, by moving electrodes on the front side to the back side of the cell, those skilled in the art have developed a main-gate-free back-contact solar cell. A back-contact solar cell is a solar cell in which electrodes in the emitter region and electrodes in the base region of the cell are all on the back side of the cell. Such a back-contact cell has many advantages. Firstly, high efficiency: since the loss resulted from the light shielding by the gate line electrodes on the front side is completely eliminated, the efficiency of the cell is improved. Secondly, the thinning of the cell can be realized. Since metallic connection devices used for serial connection are all on the back side of the cell and there is no connection from the front side to the back side, a thinner silicon wafer can be used and the cost can be thus reduced. Thirdly, it is more beautiful and the color of the front side of the cell is uniform. The aesthetic requirements of the customers are satisfied.

The back-contact solar cells comprise many structures, for example, MWT, EWT and IBC. How to connect back-contact solar cells in series to form a solar cell assembly in high efficiency and at low cost is the key to realize highly commercial production of the back-contact solar cells. A conventional method for preparing an MWT assembly is to prepare conductive backing composite material, apply conductive adhesive on the conductive backing material, punch packaging material at a corresponding position so that the conductive adhesive penetrates through the packaging material, accurately place the back-contact solar cell on the packaging material so that conductive points on the conductive backing material come into contact with electrodes on the back-contact solar cell by the conductive adhesive, and then pave an upper layer of EVA and glass on the cell, and finally overturn the whole well-stacked module and put it into a laminating press for lamination. This process has the following several shortcomings. Firstly, the used conductive backing composite material is obtained by compositing conductive metal foil, usually copper foil, to the backing material, and it is required to perform laser etching or chemical corrosion on the copper foil. Since laser etching is slow in etching complex patterns although feasible for simple patterns, the production efficiency is low. And, with regard to chemical corrosion, it is required to prepare masks with complex shape and corrosion resistance property in advance, and the chemical corrosion also cause environmental pollution and corrosion to polymeric base material by the corrosive liquid. The conductive backing material prepared in this way is complex in preparation process and extremely high in cost. Secondly, it is required to punch the packaging material behind the solar cell so that the conductive adhesive penetrates through the packaging material. Since the packaging material is usually viscoelastic material, it is difficult to perform precise punching. Thirdly, a precise dispensing apparatus is required to coat the conductive adhesive to the corresponding position of the backing material. It is feasible for MWT cells with less back contacts. In contrast, for back-contact cells with a large amount of back contacts each having a small area, it is impossible.

In the IBC technology, since the P-N junctions are placed on the back side of the cell, without any shield on the front side, and meanwhile, the electron collection distance is reduced, the efficiency of the cell can be significantly improved. For IBC cells, shallow diffusion, light doping, $SiO_2$ passivation layers, etc., are used on the front side to reduce the compositing loss, while on the back side of the cell, the diffusion regions are limited within a small region. Those diffusion regions are arranged in a lattice on the back side of the cell. Metallic contacts in the diffusion regions are limited within a very small area, appearing as a great number of small contacts. With regard to IBC cells, since the area of heavy diffusion regions on the back side of the cell is reduced, the saturation dark current in the doped region can be greatly reduced, and the open-circuit voltage and the conversion efficiency can be improved. Meanwhile, collecting current by a great number of small contacts reduces the transfer distance of the current on the back side and greatly decreases the internal series resistance of the assembly.

IBC back-contact cells have attracted much attention since they provide for high efficiency which is difficult to realize for the conventional solar cells, and have become a research hotspot of a new generation of solar cell technology. However, in the prior art, the P-N junctions in the IBC solar cell modules are positioned adjacent or close to each other and all on the back side of the cell. Accordingly, it is difficult to connect the IBC cell modules in series to form an assembly. In order to solve the above problem, there have been many improvements to the main-gate-free back-contact IBC solar cells in the prior art. In Sunpower Corp., the adjacent P or N emitters are connected by small gate lines obtained from silver paste by screen printing so that the current is guided to the edge of the cell; and big solder joints are printed on the edge of the cell, and then welded and connected in series by a connection band. At present, in the solar energy field, busbars for the current are usually formed by screen printing, for example, the newly applied patents 201310260260.8, 201310606634.7, 201410038687.8, 201410115631.8.

Patent WO2011143341A2 disclosed a main-gate-free back-contact solar cell, comprising a substrate; several adjacent P-type doping layers and N-type doping layers are located on the back side of the substrate; the P-type doping layers and the N-type doping layers are stacked with a metallic contact layer, and a passivation layer is provided between the P-type doping layers and N-type doping layers and the metallic contact layer; and a great number of nano-level connection holes are formed on the passivation layer, and the nano-level connection holes connect the P-type doping layers and N-type doping layers to the metallic contact layer. However, in this invention, connecting the metallic contact layer by nano-level holes will increase the resistance, the preparation process is complex, and high requirements are proposed to the preparation apparatus. In this invention, it is unable to integrate a number of solar cells and the electrical connection layer to one module. The integration of cells into solar cell modules is convenient to assemble the solar cell modules into an assembly, and also convenient to adjust the series/parallel connection between the modules. In this way, it can be convenient to adjust the series/parallel connection between cells in the solar cell modules, and reduce the connection resistance of the assembly.

Patent US20110041908 A1 disclosed a back-contact solar cell having, on its back side, elongated emitter regions and base regions which are interleaved, and a method for producing the same. The back-contact solar cell has a semiconductor substrate; elongated base regions and elongated emitter regions are provided on the surface of the back side of the semiconductor substrate, the base regions having a base semiconductor type, and the emitter regions having an emitter semiconductor type opposite to the base semiconductor type; the elongated emitter regions have elongated emitter electrodes for electrically contacting the emitter regions, and the elongated base regions have elongated base electrodes for electrically contacting the base regions, wherein the elongated emitter regions have smaller structural widths than the elongated emitter electrodes, and wherein the elongated base regions have smaller structural widths than the elongated base electrodes. The elongated conducting members used in this invention allow the solar cell to have excellent current collection performance. However, it is necessary to provide a large number of conducting members to effectively collect the current. Therefore, the manufacturing cost is increased, and the process steps are complex.

Patent EP2709162A1 disclosed a solar cell, used in a main-gate-free back-contact solar cell, and disclosed electrode contact units which are spaced apart from each other and arranged alternately. The electrode contact units are connected by longitudinal connectors to form an "I"-shaped electrode structure. However, this structure forms two connections on the cells. The first connection is to connect the cells to the electrode contact units, and the second connection is to connect the electrode contact units by connectors. The two connections result in complex process and too many electrode contacts. As a result, "disconnection" or "misconnection" may be caused. This is disadvantageous to the overall performance of the main-gate-free back-contact solar cell.

At present, in the inventions in the art, small gate lines are used for current collection. This is feasible for 5-inch cells. However, for 6-inch or bigger silicon wafers that are popular in the prior art, problems such as the rise of the series resistance and the reduction of the filling factor may occur. Consequently, the power of the manufactured assembly is significantly decreased. For IBC cells in the prior art, wider gate lines made of silver paste can be formed between the adjacent P or N emitters by screen printing to reduce the series resistance. However, the increase of the silver amount causes the sharp increase of the cost, and meanwhile, wide gate lines result in deteriorated insulating effect between P and N emitters and easy current leakage.

SUMMARY OF THE PRESENT INVENTION

In view of shortcomings in the prior art, an objective of the present invention is to provide a main-gate-free and high-efficiency back-contact solar cell module, a main-gate-free and high-efficiency back-contact solar cell assembly, and a preparation process thereof, which can effectively prevent the short-circuiting of the P-electrode and the N-electrode and has the advantages of high cracking resistance, high efficiency and high stability, as well as simple preparation process and greatly reduced cost.

To achieve this purpose, the present invention complies with the following technical solutions.

A main-gate-free and high-efficiency back-contact solar cell module is provided, comprising cells and an electrical connection layer, a backlight side of the cells having P-electrodes connected to a P-type doping layer and N-electrodes connected to a N-type doping layer, the electrical connection layer comprises a number of parallel leads each electrically connected to the P-electrodes or the N-electrodes.

The P-electrodes are dotted P-electrodes or linear P-electrodes, and the N-electrodes are dotted N-electrodes or linear N-electrodes.

The diameter of the dotted P-electrode is 0.4 mm to 1.5 mm, the distance between two adjacent dotted P-electrodes connected to a same one of the leads is 0.7 mm to 10 mm, and the width of the linear P-electrodes is 0.4 mm to 1.5 mm; and the diameter of the dotted N-electrodes is 0.4 mm to 1.5 mm, the distance between two adjacent dotted N-electrodes connected to a same one of the leads is 0.7 mm to 10 mm, and the width of the linear N-electrodes is 0.4 mm to 1.5 mm.

The total number of the dotted P-electrodes and the dotted N-electrodes is 1000 to 40000.

The dotted electrodes or linear electrodes are made of any one of silver paste, conductive adhesive, conductive polymeric material or tin solder.

The distance between a lead connected to the P-electrodes and a lead connected to the N-electrodes is 0.1 mm to 20 mm.

The lead is made of any one or more of copper, aluminum, steel, copper clad aluminum or copper clad steel; the cross-section of the lead is any one or more of a circular shape, a square shape or an elliptical shape; and the diameter of a circumcircle of the cross-section shape of the lead is 0.05 mm to 1.5 mm.

The surface of the lead is plated with anti-oxidation plating material or coated with a conductive adhesive.

The anti-oxidation plating material is any one of tin, tin-lead alloy, tin-bismuth alloy or tin-lead-silver alloy; and the thickness of the plating layer or conductive adhesive layer of the lead is 5 μm to 50 μm.

The conductive adhesive is a low-resistivity conductive adhesive that uses a conductive particle and a polymeric binder as main components.

The conductive particle in the conductive adhesive is any one or more of gold, silver, copper, god-plated nickel, silver-plated nickel and silver-plated copper; and the shape of the conductive particle is any one or more of a spherical shape, a flake shape, an olivary shape and an acicular shape; and the particle size of the conductive particle is 0.01 μm to 5 μm.

The polymeric binder in the conductive adhesive is any one of or a combination of two of epoxy resin, polyurethane resin, acrylic resin or organic silicone resin, and the binder is thermosetting or photocureable.

The number of the leads is 10 to 500.

The electrical connection layer is provided with P-busbar electrodes and N-busbar electrodes, which are arranged on two sides of the electrical connection layer.

The surface of the busbar electrodes has a concave-convex shape.

A thermoplastic resin or thermosetting resin is provided at an insulating layer between the P-electrodes and the N-electrodes.

The resin is any one of or a combination of two of ethylene-vinyl acetate copolymer, polyolefin resin, epoxy resin, polyurethane resin, acrylic resin and organic silicon resin.

A main-gate-free and high-efficiency back-contact solar cell assembly is provided, comprising fronting material, packaging material, a solar cell layer, packaging material and backing material, which are connected from top to bottom, the solar cell layer comprises a number of solar cell modules, the solar cell module refers to the solar cell module described above, and the adjacent ones of the solar cell modules are electrically connected via busbars located on two sides of an electrical connection layer.

The number of cells contained in the main-gate-free and high-efficiency back-contact solar cell assembly, the number of cell modules, and the number of cells in a cell module can be defined by the following formula, where Z denotes the total number of cells in the cell assembly, Y denotes the number of the cell modules, and X denotes the number of cells contained in each of the cell module, wherein $1 \leq Y \leq X \leq Z$ and $X \times Y = Z$. When X=1, the length of one lead is equal to the length of one cell; and when Y=1, the cells are connected together, that is, all cells in the cell assembly are connected by one lead.

Solar cells in each of the solar cell modules are connected in series to each other; and the solar cell modules are successively connected in series to each other, and the number of solar cells in each of the solar cell modules is identical.

The number of cells in the solar cell layer is 1 to 120, wherein the solar cell layer comprises 1 to 120 cell modules and each of the cell modules comprises 1 to 120 cells.

The busbars are connected by a conductive medium.

The conductive medium comprises any one of silver paste, conductive adhesive or tin solder.

A method for preparing a main-gate-free and high-efficiency back-contact solar cell assembly, comprising the following steps:

step 1 of preparing solar cell modules: straightening and tightening a number of parallel leads, and electrically connecting each of the leads to P-electrodes and N-electrodes located on the back of a cell; disposing the P-busbar electrodes and the N-busbar electrodes on two sides of an electrical connection layer to prepare solar cell modules;

step 2 of preparing a solar cell layer: electrically connecting the solar cell modules prepared in the step 1 by busbar electrodes to prepare a solar cell layer; and step 3 of successively stacking and laminating fronting material, packaging material, a solar cell layer, packaging material and backing material to obtain a cell assembly.

In the method for preparing a main-gate-free and high-efficiency back-contact solar cell assembly, the P-electrodes and the N-electrodes on the cell in the step 1 have a mirror-symmetric structure in a horizontal plane; and when the number of cells is greater than 1, the cells are assembled in such a manner that, after the first cell is connected to the electrical connection layer, the second cell is rotated by 180° in the horizontal plane and edges of the two cells are aligned to each other so that the P-electrodes on the second cell and the N-electrodes on the first cell are on a same lead, and then the third back-contact cell is placed normally so that the P-electrodes on the third cell and the N-electrodes on the second cell are on a same lead; and the above operations are repeated to form a serial connection structure and a solar cell layer is thus formed.

In the method for preparing a main-gate-free and high-efficiency back-contact solar cell assembly, the cell and the lead in the step 1 are electrically connected by coating conductive adhesive on a P-type doping layer and a N-type doping layer on a cell by screen printing; the conductive adhesive, when heated, can be solidified to form the P-electrodes and the N-electrodes; and when heated, the lead and the P-electrodes or the N-electrodes come into Ohm contact by the conductive adhesive, and in this way, the lead and the cell are electrically connected.

The cell and the lead are also electrically connected by plating low-melting-point material on the lead by a plating process; when heated, the lead and the P-type doping layer or the N-type doping layer are welded by the melting of the low-melting-point material to form the P-electrodes and the N-electrodes, and in this way the lead and the cell are electrically connected; and the low-melting-point material is any one of tin solder, tin-lead alloy, tin-bismuth alloy or tin-lead-silver alloy.

In the heating process, a heating pad is used on a front side of the cell;

and the heating temperature of the heating pad is 40° C. to 80° C.

The way of heating is any one or more of infrared radiation, heating by resistance wires or heating by hot wind; and the heating temperature is 150° C. to 500° C.

the plating process is any one of hot dipping, electroplating or chemical plating.

With the above technical solutions, the present invention has the following advantages when compared to the prior art.

Firstly, in the present invention, the efficiency of the cell is improved since the loss resulted from the shielding by gate line electrodes on the front side is eliminated.

Secondly, the thinning of the cell can be realized. Since metallic connection devices used for serial connection are all on the back side of the cell and the connection from the front side to the back side in the past is eliminated, a thinner silicon wafer can be used and the cost can be thus reduced.

Thirdly, the back-contact solar cell of the present invention is generally applicable to various structures such as MWT, EWT and IBC, and is thus highly practicable.

Fourthly, a photovoltaic system integrated by the assembles produced by the technology of the present invention can completely avoid the problem of significant reduction of current of the whole string, which is because that certain current is lost due to the cracking of one cell. Since the multi-point connection between the conductors and the cells is realized by the main-gate-free back-wiring technology proposed by the present invention, the whole system is highly tolerant to hidden-cracks and micro-cracks caused during the production, transportation, assembling and using processes, and shows great overall performance.

Fifthly, the multi-point and decentralized contact between the solar cell electrodes and the electrical connection layer in the present invention reduces the electron collection distance and greatly decreases the series resistance of the assembly.

Sixthly, the preparation of an electrical connection layer by the main-gate-free wiring technology of the present invention to realize the collection of electrons of the cell makes the preparation process more simple and greatly reduces the production cost of the solar cell.

Seventhly, since the back-contact solar cell of the present invention needs no main gate, the amount of silver paste is greatly reduced so that the manufacturing cost of the back-contact cell is significantly reduced.

Eighthly, the arrangement of busbar electrodes in a concave-convex shape can increase the contact area of the electrodes and decrease the resistance.

The technology of the present invention can realize the welding between the conductors and the cells, and can drastically improve the long-term reliability of the assembly. In an assembly prepared by this technology, the IBC cells and the conductors are in multi-point connection, and the connection points are distributed more intensively, up to thousands or even tens of thousands of connection points. In portions where hidden-cracks and micro-cracks are found on the silicon wafer, the current conduction path is further optimized. Therefore, since the loss resulted from cracks is greatly reduced, the quality of products is improved. Usually, in a photovoltaic system, when hidden-cracks occur on a cell, the upper region of the cell will be separated from the main gate, and consequently, current generated in this region cannot be collected. In a photovoltaic system, the cells are connected in series to form a matrix, and thus this system exhibits obvious bucket effect. When hidden-cracks occur on one cell and certain current is thus lost, the current of the whole string will be significantly decreased. As a result, the power generation efficiency of the whole string is drastically decreased. A photovoltaic system integrated by assembles produced by the technology of the present invention can completely avoid such problems. Since the multi-point connection between the conductors and the cells is realized by the main-gate-free back-wiring technology proposed by the present invention, the whole photovoltaic system is highly tolerant to hidden-cracks and micro-cracks caused during the production, transportation, assembling and using processes. This can be explained by a simple example. A solar assembly produced by the conventional technologies is just like a common piece of glass which as a whole is broken when only one point is crushed. However, an assembly produced by the main-gate-free back-wiring technology is just like a piece of laminated glass which, as a whole, still functions to keep out wind and rain even it looks not so beautiful when one point is crushed. This technology breaks through the conventional cell stringing process, by which the cells are arranged more freely and intensively. An assembly produced by this technology is expected to be smaller and lighter. For the development of downstream programs, it means smaller area for mounting, lower roof bearing requirements, and less manpower. By the main-gate-free back-wiring technology, low-cost and high-efficiency connection of back-contact solar cells can be realized. The replacement of silver main gates with copper wires reduces the cost, so that the real industrial and large-scale production of back-contact solar cells is realized. This reduces the cost while improving the efficiency, and provides, for the photovoltaic system, photovoltaic assemblies with higher efficiency, lower cost, better stability and more excellent hidden-crack resistance performance. The competitiveness of photovoltaic systems relative to the conventional energy is greatly improved.

The overall structure of the main-gate-free and high-efficiency back-contact solar cell used in the present invention is substantially the same as the conventional back-contact solar cell, with the only difference that a thermoplastic resin or thermosetting resin is provided on the insulating layer between the electrodes in the emitter region and the electrodes in the base region by screen printing, after silver paste sintering and graded power tests performed on the back-contact solar cell are completed. This resin, on one hand, can isolate the electrodes in the emitter region and the electrodes in the base region, and on the other hand, can bond the back-contact solar cells and the backing material together during the laminating operation.

BRIEF DESCRIPTION OF THE DRAWINGS

FIG. 11 is a partial cross-sectional view of a solar cell assembly containing the main-gate-free and high-efficiency back-contact solar cell module, according to Embodiment 3, in which:

1: metal materials such as copper, aluminum or steel; 2: metal materials different from 1, such as aluminum or steel; 3: tin, tin-lead, tin-bismuth, or tin-lead-silver alloy solder; 4: N-type doping layer; 41: dotted N-electrode; 42: linear N-electrode region; 43: N-lead connected to the N-electrode; 44: linear N-electrode; 5: P-type doping layer; 51: dotted P-electrode; 52: linear P-electrode region; 53: P-lead connected to the P-electrode; 54: linear P-electrode; 6: N-type monocrystal silicon substrate; 7: insulating layer; 8: fronting material; 81: backing material; 82: packaging material; 9: busbar electrode; 91: N-busbar electrode; 92: P-busbar electrode; 10: solar cell layer; 101: first back-contact cell; 102: second back-contact cell; and 103: third back-contact cell.

DETAILED DESCRIPTION OF THE PRESENT INVENTION

Embodiment 1

Figure 1:
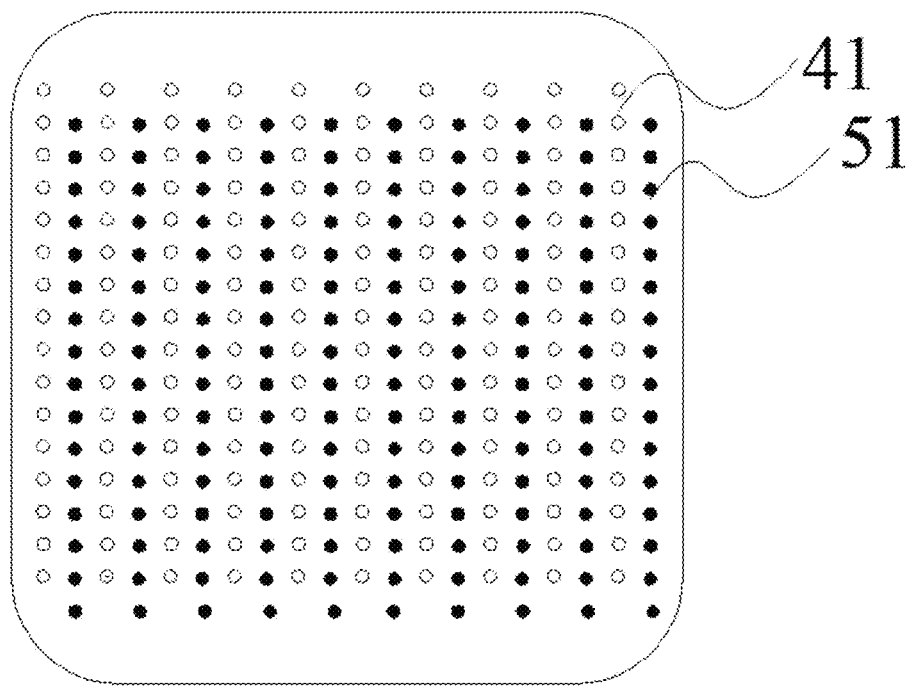
FIG. 1 is a schematic view of the back side of a dotted main-gate-free and high-efficiency back-contact solar cell.
Figure 4:
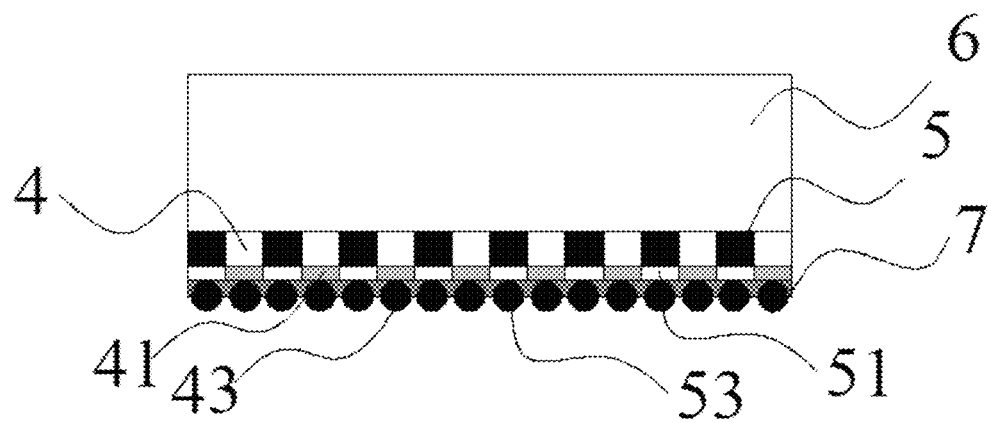
FIG. 4 is a cross-sectional view of a main-gate-free and high-efficiency back-contact solar cell module, according to Embodiment 1 and Embodiment 2.

As shown in FIG. 1 and FIG. 4, a main-gate-free and high-efficiency back-contact solar cell module comprises cells and an electrical connection layer. The cell comprises a N-type monocrystal silicon substrate 6, the back side of which has P-electrodes connected to a P-type doping layer 5 and N-electrodes connected to a N-type doping layer 4, with a thermoplastic resin or thermosetting resin being provided at an insulating layer 7 between the P-electrodes and the N-electrodes. Wherein, the P-electrodes are dotted P-electrodes 51, and the N-electrodes are dotted N-electrodes 41; the dotted P-electrodes 51 and the dotted N-electrodes 41 are arranged alternately; and there are total 2080 dotted P-electrodes 51 and dotted N-electrodes 41. The diameter of the dotted P-electrodes 51 is 0.8 mm, and the distance between two adjacent dotted P-electrodes 51 is 1.5 mm. The diameter of the dotted N-electrodes 41 is 0.7 mm, the distance between two adjacent dotted N-electrodes 41 is 1.5 mm, and the center distance between a connection line of the dotted P-electrodes 51 and a connection line of the dotted N-electrodes 41 is 15 mm. The electrode contacts are tin solders. The conversion efficiency of the cell is 20.2%.

Figure 5:
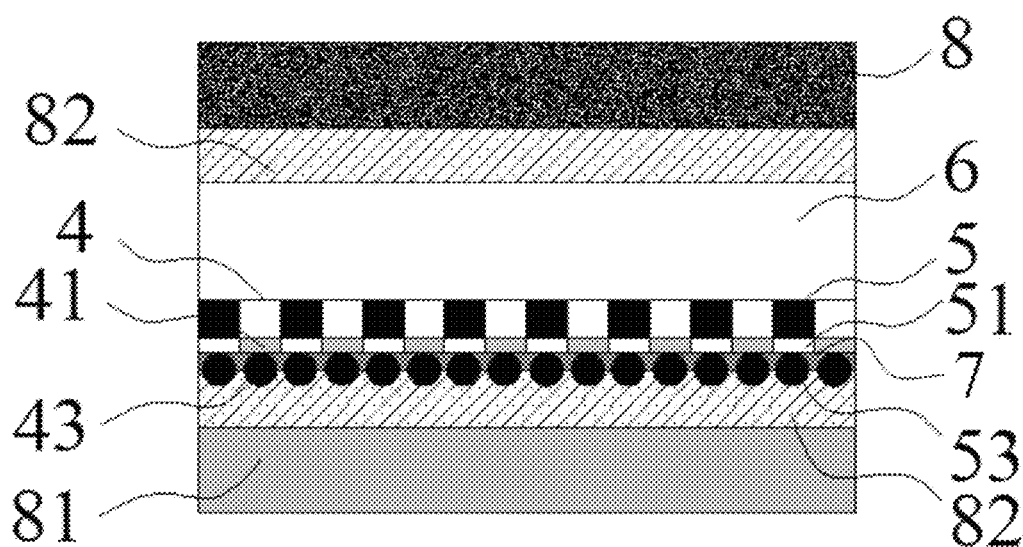
FIG. 5 is a partial cross-sectional view of a solar cell assembly containing the main-gate-free and high-efficiency back-contact solar cell module, according to Embodiment 1 and Embodiment 2.
Figure 6:
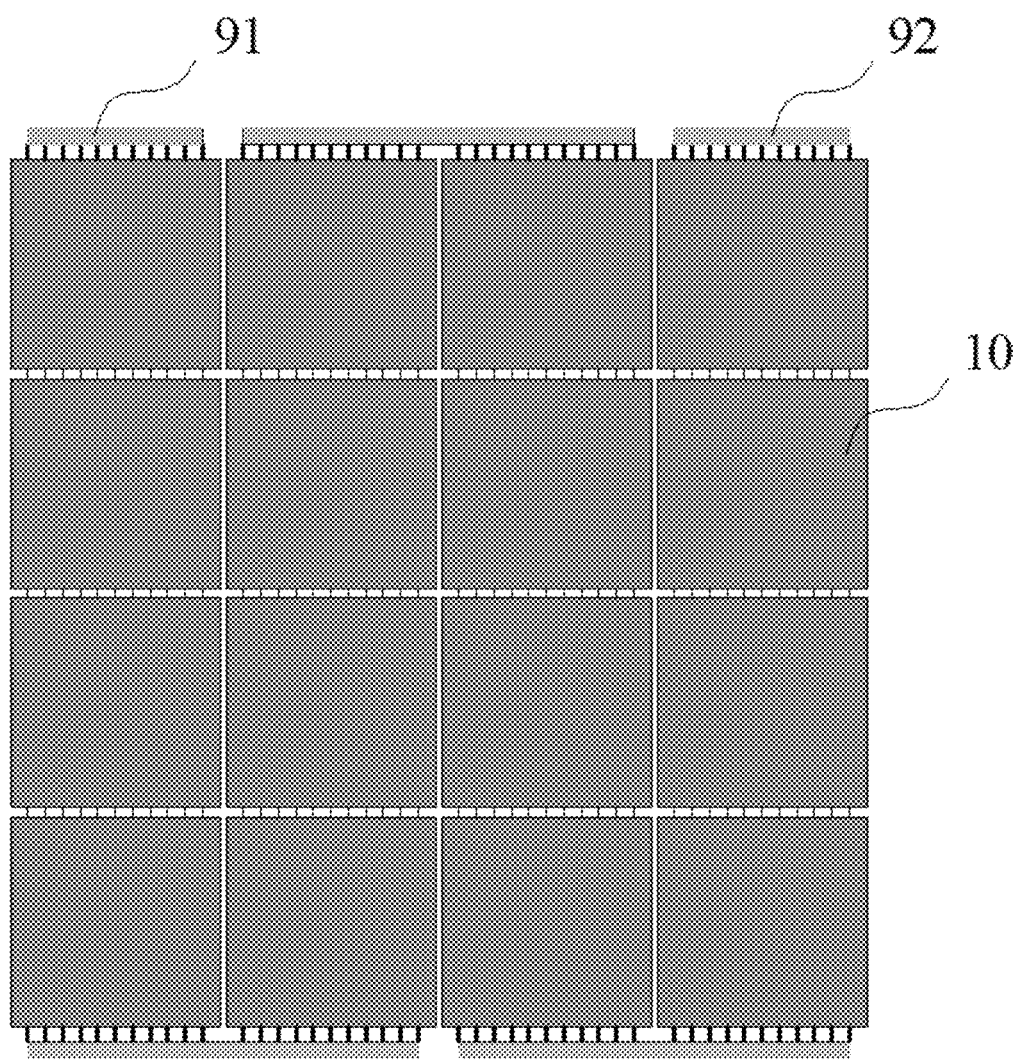
FIG. 6 is a partial schematic view of a solar cell layer of the solar cell assembly.

As shown in FIG. 5, a solar cell assembly comprising the above-described main-gate-free and high-efficiency back-contact solar cell module comprises fronting material 8, a solar cell layer 10 and backing material 81 from top to bottom. As shown in FIG. 6, the solar cell layer 10 comprises a number of the above-described solar cell modules.

Figure 8:
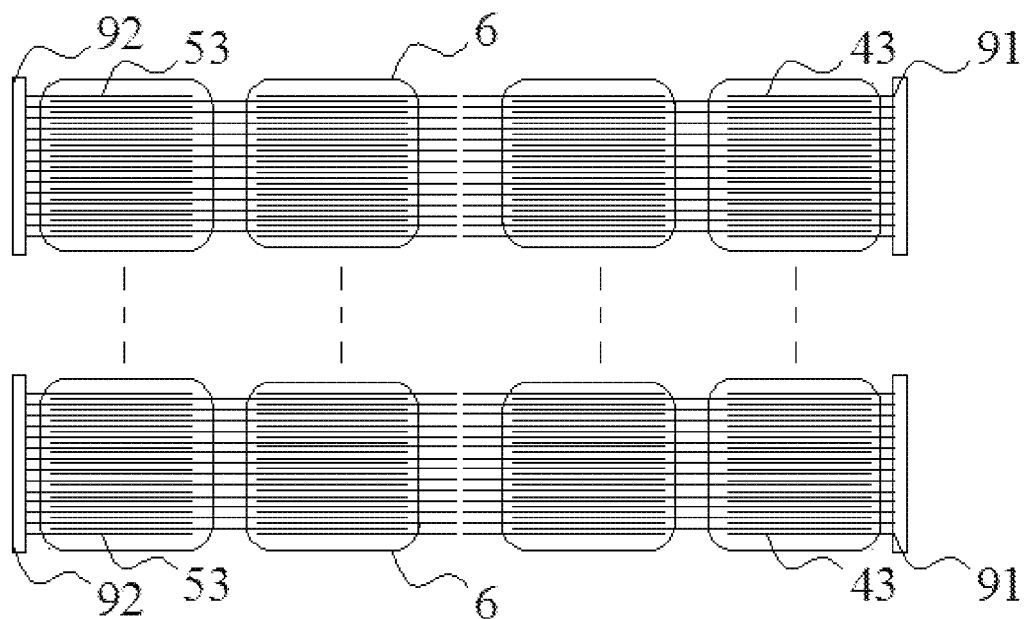
FIG. 8 is a partial schematic view of a cell module, according to Embodiment 1 and Embodiment 3.

As shown in FIG. 8, a method for preparing a solar cell assembly comprising the above-described main-gate-free and high-efficiency back-contact solar cell module comprises the following steps.

Figure 3:
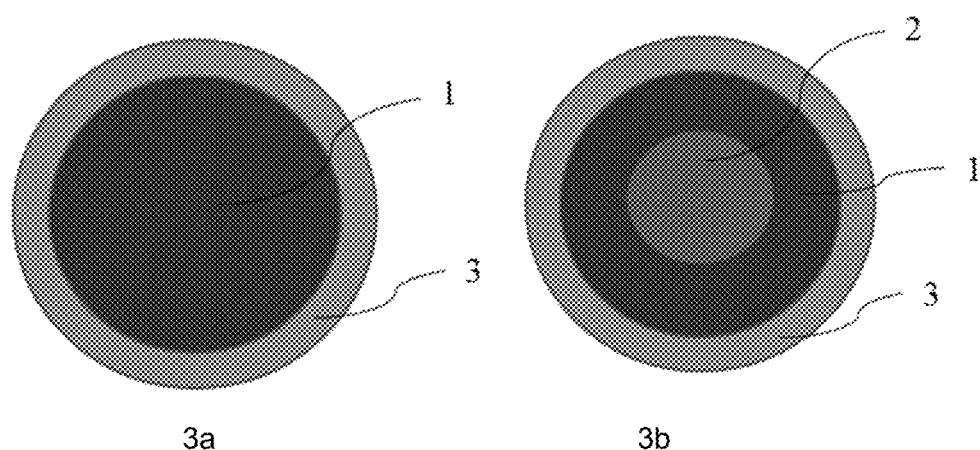
FIG. 3 is a cross-sectional view of a lead (FIG. 3*a* is a cross-sectional of a lead having two material layers and FIG. 3*b* is a cross-sectional of a lead having three material layers)
Figure 7:
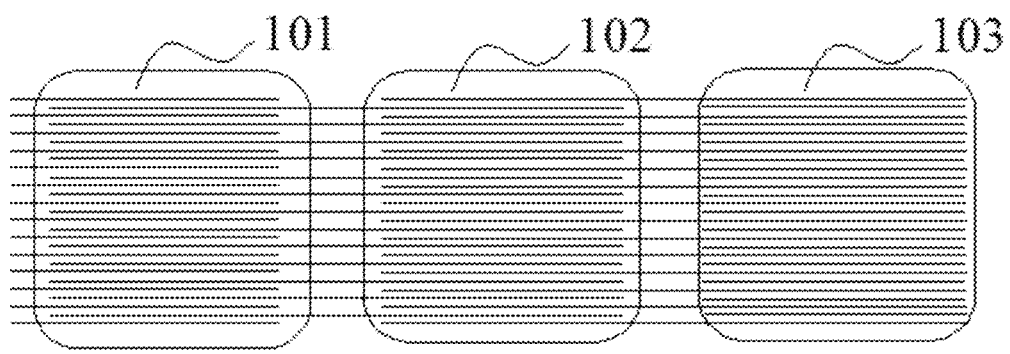
FIG. 7 is a partial schematic view of a cell string.

Step 1: Preparation of main-gate-free and high-efficiency back-contact solar cell modules. As shown in FIG. 7, 10 leads having a length of 154 mm and a diameter of 1.3 mm are straightened and tightened, and according to the pattern of the back side of the first back-contact cell 101, the leads are respectively welded to the dotted P-electrodes on the back side of the cell by soldering irons to form P-leads 53; and then, 10 leads, of a same type, having a length of 298 mm are straightened and tightened, and according to the pattern of the back side of the first back-contact cell 101, the leads are respectively welded to the dotted N-electrodes on the back side of the cell by soldering irons to form N-leads 43. As shown in FIG. 3b of FIG. 3, the leads are tin-plated metal wires having three structural layers, including an innermost layer of steel wires having a diameter of 0.8 mm, an intermediate copper layer having a thickness of 0.2 mm, and an outermost tin-plated layer having a thickness of 0.3 mm. The tin-plated metal wires have a circular cross-section and a diameter of 1.3 mm.

Step 2: Preparation of an electrical connection layer. As shown in FIG. 7, after the completion of the arrangement of the first back-contact cell 101, the second back-contact cell 102 is rotated by 180° in the horizontal plane to be aligned with edges of the main-gate-free and high-efficiency back-contact solar cell module, so that the dotted P-electrodes 51 on the second back-contact cell 102 are exactly on the extension of the tin-plated metal wires on the first back-contact cell 101 welded to the dotted N-electrodes 41. Then, those tin-plated metal wires are welded onto the dotted P-electrodes 51 on the second back-contact cell 102. Then, 10 tin-plated metal wires, of a same type, having a length of 298 mm are welded onto the dotted N-electrodes 41 on the second back-contact cell 102, according to the pattern of the back side of the back-contact cell; and then the third back-contact cell 103 is placed normally, so that the extensions of the tin-plated metal wires welded onto the dotted P-electrodes 51 on the third back-contact cell 102 and onto the dotted N-electrodes 41 on the second back-contact cell 102 are superposed, and then the tin-plated metal wires are welded together. Similarly, a series connection structure as shown in FIG. 7 is formed. The temperature for welding is 300° C. to 400° C. In the heating process, a heating pad can be used on the front side of the cell, in order to prevent the cell from breaking or hidden-cracking due to a big temperature difference on the two sides of the cell. The heating temperature of the heating pad is controlled at 40° C. to 80° C. As shown in FIG. 8, the finished series connection structures as shown in FIG. 6 are connected in series by conventional and general busbars having a cross-sectional area of 8×0.22 mm, and the P-leads 53 are connected by P-busbar electrodes 92, and the N-leads 43 are connected by N-busbar electrodes 91. In this way, four strings of back-contact cell modules are formed, each string having eight back-contact cell modules and thirty two in total.

Step 3: Preparation of a main-gate-free and high-efficiency back-contact solar cell assembly. The fronting material 8, packaging material 82, a solar cell layer 10, packaging material 82 and backing material 81 are successively stacked, and appearance inspection is performed, wherein the packaging material 82 is EVA, the well-stacked module is put into a laminating press for lamination, and parameters for the laminating operation are set according to the vulcanizing properties of the EVA, usually, laminating for 16 min at 145° C. At last, a metal frame and a terminal box are mounted on the laminated module, and then power test and appearance inspection are performed.

The above-described 32 back-contact assemblies have the following power parameters:
Open-circuit voltage: Uoc (V) 22.25;
short-circuit current: Isc (A) 9.25;
working voltage: pmp (V) 17.27;
working current: Imp (A) 9.08;
maximum power: Pmax (W) 156.78; and
filling factor: 76.18%.

Embodiment 2

As shown in FIG. 1 and FIG. 4, a main-gate-free and high-efficiency back-contact solar cell module comprises cells and an electrical connection layer. The cell comprises a N-type monocrystal silicon substrate 6, the back side of which has P-electrodes connected to a P-type doping layer 5 and N-electrodes connected to a N-type doping layer 4, with a thermoplastic resin or thermosetting resin being provided at an insulating layer 7 between the P-electrodes and the N-electrodes. As shown in FIG. 1, the P-electrodes are dotted P-electrodes 51, and the N-electrodes are dotted N-electrode 41; the dotted P-electrodes 51 and the dotted N-electrodes 41 are arranged alternately; and the total number of dotted P-electrodes 51 and dotted N-electrodes 41 is 24200. The diameter of the dotted P-electrodes 51 is 0.5 mm, and the distance between two adjacent dotted P-electrodes 51 is 1.4 mm. The diameter of the dotted N-electrodes 41 is 0.4 mm, the distance between two adjacent dotted N-electrodes 41 is 1.4 mm, and the center distance between a connection line of the dotted P-electrodes 51 and a connection line of the dotted N-electrodes 41 is 0.7 mm. The electrode contacts are tin solders. The conversion efficiency of the cell is 20.3%.

As shown in FIG. 5, a solar cell assembly comprising the above-described main-gate-free and high-efficiency back-contact solar cell module comprises fronting material 8, a solar cell layer 10 and backing material 81 from top to bottom. As shown in FIG. 6, the solar cell layer 10 comprises a number of main-gate-free and high-efficiency back-contact solar cell modules.

Figure 9:
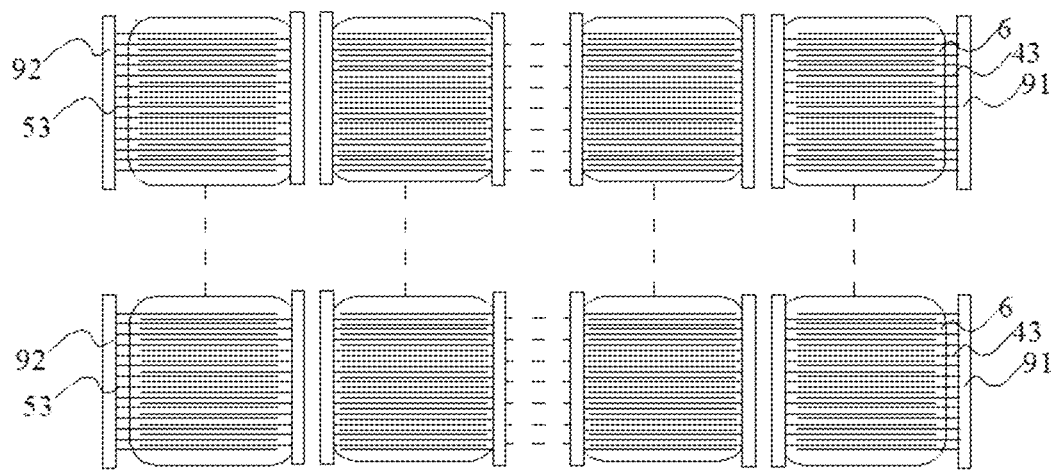
FIG. 9 is a partial schematic view of a cell module, according to Embodiment 2.

As shown in FIG. 9, a method for preparing a solar cell assembly comprising the above-described main-gate-free and high-efficiency back-contact solar cell module comprises the following steps.

Step 1: Preparation of main-gate-free and high-efficiency back-contact solar cell modules. As shown in FIG. 9, 110 leads having a length of 154 mm and a diameter of 0.3 mm are straightened and tightened, and according to the pattern of the back side of the first back-contact cell 101, the leads are respectively welded to the dotted P-electrodes 51 on the back side of the cell by heating via infrared light to form P-leads 53; and then, 110 leads, of a same type, having a length of 154 mm are straightened and tightened, and according to the pattern of the back side of the first back-contact cell 101, the leads are respectively welded to the dotted N-electrodes 41 on the back side of the cell by soldering irons to form N-leads 43. In this way, an electrical connection layer is formed. On the two sides of the electrical connection layer, by using conventional and general busbars having a cross-sectional area of 5×0.22 mm, leads connected to the dotted P-electrodes 51 are connected by P-busbar electrodes 92, and leads connected to the dotted N-electrodes are connected by N-busbar electrodes 91. As shown in FIG. 3a of FIG. 3, the leads are tin-plated metal wires having two structural layers, including an inner copper layer having a diameter of 0.25 mm, and an outer tin-plated layer having a thickness of 0.025 mm. The tin layer contains tin and lead 60/40, i.e., 60% of tin and 40% of lead. The tin-plated metal wires have a circular cross-section and a diameter of 0.28 mm.

Step 2: Preparation of an electrical connection layer 10. Edges of 10 main-gate-free and high-efficiency back-contact solar cell modules manufactured above are aligned, so that the P-busbar electrodes 92 of a solar cell module and the N-busbar electrodes 91 of an adjacent solar cell module are aligned and connected by a conductive medium. The conductive medium is tin solder. The temperature for welding is 300° C. to 400° C. In this way, solar cell strings as shown in FIG. 9 are formed. Similarly, six strings of main-gate-free and high-efficiency back-contact solar cell modules are prepared. The P-busbar electrodes 92 on the left and right ends of main-gate-free and high-efficiency back-contact solar cell modules in each string are connected in series. In this way, six strings of main-gate-free and high-efficiency back-contact solar cell layers 10 are formed, each string having ten high-efficiency back-contact solar cell layers 10, and sixty in total. Wherein, the used busbars are conventional busbars having a cross-sectional area of 8×0.22 mm.

Step 3: Preparation of a solar cell assembly. The fronting material 8, EVA, a solar cell layer 10, EVA and backing material 81 are successively stacked, and appearance inspection is performed, wherein the well-stacked module is put into a laminating press for lamination, and parameters for the laminating operation are set according to the vulcanizing properties of the EVA, usually, laminating for 16 min at 145° C. At last, a metal frame and a terminal box are mounted on the laminated module, and then power test and appearance inspection are performed.

The above-described 60 back-contact assemblies have the following power parameters:
Open-circuit voltage: Uoc (V) 40.36;
short-circuit current: Isc (A) 9.34;
working voltage: pmp (V) 31.78;
working current: Imp (A) 9.25;
maximum power: Pmax (W) 293.96; and
filling factor: 77.98%.

Embodiment 3

Figure 2:
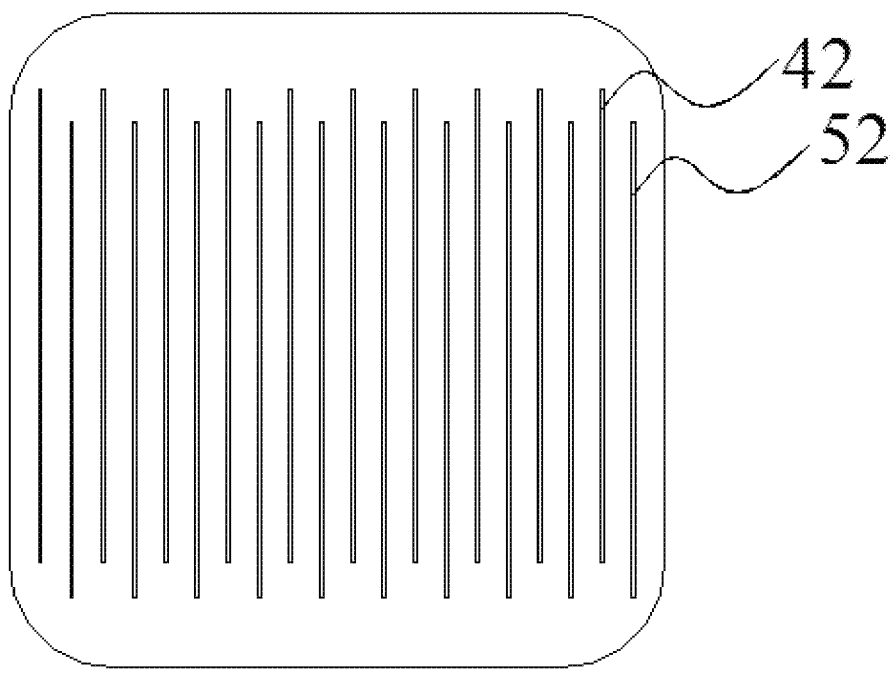
FIG. 2 is a schematic view of the back side of a linear main-gate-free and high-efficiency back-contact solar cell.

As shown in FIG. 2 and FIG. 4, a main-gate-free and high-efficiency back-contact solar cell module comprises cells and an electrical connection layer. The cell comprises a N-type monocrystal silicon substrate 6, the back side of which has a P-type doping layer 5 and a N-type doping layer 4, with linear P-electrode regions 52 are formed on the P-type doping layer 5, linear N-electrode regions 42 are formed on the N-type doping layer 4, and the linear P-electrode regions 52 and the linear N-electrode regions 42 are alternately arranged. The width of the linear P-electrode regions 52 is 0.7 mm, and the distance between adjacent linear P-electrode regions 52 is 1.5 mm. The width of the linear N-electrode regions 42 is 0.5 mm, the distance between adjacent linear N-electrode regions 42 is 1.5 mm, and the center distance between the linear P-electrode regions 52 and the linear N-electrode regions 42 is 2.0 mm. The conversion efficiency of the cell is 20.5%. An insulating layer 7 is provided between the linear P-electrode regions 52 and the linear N-electrode regions 42, and the insulating layer 7 is a thermoplastic resin or thermosetting resin. The electrical connection layer comprises a number of parallel leads each electrically connected to the linear P-electrode regions 52 or the linear N-electrode regions 42 to form the linear P-electrodes 54 or linear N-electrodes 44.

Figure 10:
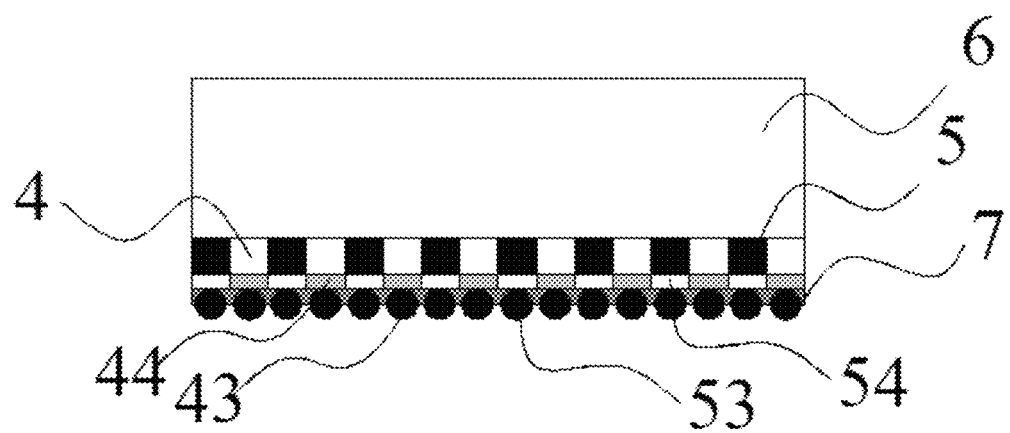
FIG. 10 is a cross-sectional view of a main-gate-free and high-efficiency back-contact solar cell, according to Embodiment 3.
Figure 11:
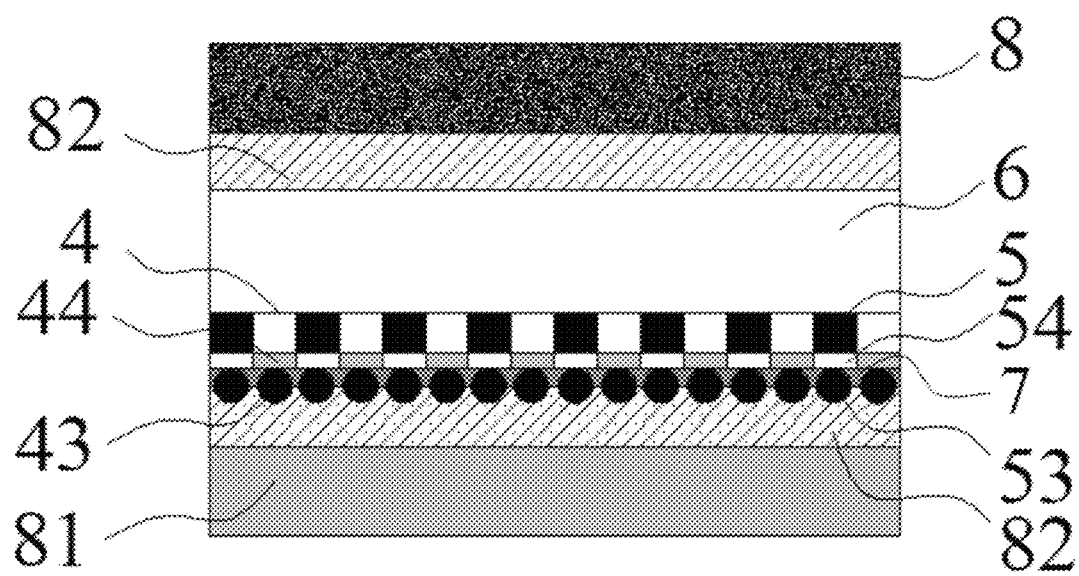

As shown in FIG. 10, a solar cell assembly comprising the above-described main-gate-free and high-efficiency back-contact solar cell module comprises fronting material 8, a solar cell layer 10 and backing material 81 from top to bottom. As shown in FIG. 6, the solar cell layer 10 comprises a number of main-gate-free and high-efficiency back-contact solar cell modules.

As shown in FIG. 9, a method for preparing a solar cell assembly comprising the above-described main-gate-free and high-efficiency back-contact solar cell module comprises the following steps.

Step 1: Preparation of back-contact solar cell modules. As shown in FIG. 7, 100 tin-plated wires, with two structural layers, having a length of 154 mm and a diameter of 0.33 mm are straightened and tightened, and are placed in the linear P-electrode regions of the first back-contact cell 101;

then, the second back-contact cell 102 is rotated by 180° in the horizontal plane so that edges of the two cells are aligned to each other; and then, 100 tin-plated wires, of a same type, having a length of 298 mm are placed in the linear N-electrode regions 42 of the first back-contact cell 101 according to the pattern of the back side of the back-contact cell. Now, certainly, those leads are correspondingly arranged in the linear P-electrode regions 52 of the second back-contact cell 102. The third back-contact cell 103 is placed normally so that the linear N-electrode regions 42 on the second back-contact cell 102 and the linear P-electrode regions 52 on the third back-contact cell 103 are aligned, and 100 tin-plated wires, with two structural layers, having a length of 298 mm and a diameter of 0.33 mm, are placed on the linear line. Then, 100 tin-plated wires, with two structural layers, having a length of 154 mm and a diameter of 0.33 mm, are placed in the linear N-electrode regions 42 on the third back-contact cell 103. Meanwhile, it is ensured that lead extensions having a length of 2 mm are reserved at left and right ends of the solar cell module in this embodiment, for the purpose of welding to the busbars. At last, a small pressure is applied to the well-arranged three back-contact cells and the tin-plated wires, and then they are heated by hot wind so that the tin-lead solders on the tin-plated wires are molten to come into Ohm contact with the electrode regions on the back-contact cells. In this way, linear P-electrodes 54 are formed in the linear P-electrode regions 52, and linear N-electrodes 44 are formed in the linear N-electrode regions 42. Finally, a series connection structure as shown in FIG. 8 is formed. This series connection structure is one solar cell module. The temperature for heating by hot wind is 300° C. to 400° C. As shown in FIG. 3a of FIG. 3, the leads in this embodiment are tin-plated metal wires having two structural layers, including an inner copper layer having a diameter of 0.3 mm, and an outer tin-plated layer having a thickness of 0.025 mm. The tin layer contains tin and lead 60/40, i.e., 60% of tin and 40% of lead. The tin-plated metal wires have a circular cross-section and a diameter of 0.33 mm.

Step 2: Preparation of a solar cell layer 10. The above-prepared three solar cell modules are connected in series by conventional and general busbars having a cross-sectional area of 4×0.3 mm, P-leads 53 connected to the linear P-electrodes 54 are connected by P-busbar electrodes 92, and N-leads 43 connected to the linear N-electrodes 44 are connected by N-busbar electrodes 91. In this way, three strings of solar cell layers 10 are formed, each string having three solar cell layers 10, and nine in total.

Step 3: Preparation of a main-gate-free and high-efficiency back-contact solar cell assembly. The fronting material 8, packaging material 82, a solar cell layer 10, packaging material 82 and backing material 81 are successively stacked, and appearance inspection is performed, wherein the packaging material 82 is EVA, the well-stacked module is put into a laminating press for lamination, and parameters for the laminating operation are set according to the vulcanizing properties of the EVA, usually, laminating for 16 min at 145° C. At last, a metal frame and a terminal box are mounted on the laminated module, and then power test and appearance inspection are performed.

The above-described 9 back-contact assemblies have the following power parameters:
Open-circuit voltage: Uoc (V) 6.21;
short-circuit current: Isc (A) 9.28;
working voltage: pmp (V) 4.89;
working current: Imp (A) 9.06;
maximum power: Pmax (W) 44.30; and
filling factor: 76.87%.

It can be known from the experiment parameters in Embodiment 1 to Embodiment 3 that, a solar cell assembly formed by the main-gate-free and high-efficiency back-contact solar cell module of the present invention can obtain a high filling factor. Accordingly, the power generation efficiency of the assembly is improved. The short-circuiting between P-electrodes and N-electrodes can be effectively prevented. The present invention also has the advantages of hidden-cracking resistance, high efficiency and high stability. Meanwhile, this technology also has simple preparation process and greatly reduced cost.

The foregoing is specific description of feasible embodiments of the present invention, and those embodiments are not intended to limit the patent scope of the present invention. Any equivalent implementations or alternations without departing from the present invention shall be included in the patent scope of the present invention.

In addition, various modifications, additions and replacements in terms of form and detail can be made by those skilled in the art within the scope and spirit defined by the appended claims of the present invention. Of course, such various modifications, additions and replacements made within the spirit of the present invention shall be included in the protection scope of the present invention.

The invention claimed is:

1. A back-contact solar cell assembly, comprising at least a first solar cell module and a second solar cell module;
with the first solar cell module comprising first solar cell module cells a first solar cell module electrical connection layer, a first solar cell module backlight side of the first solar cell module cells having
first solar cell module P-electrodes connected to a first solar cell module P-type doping layer wherein there are no through holes in the first solar cell module P-type doping layer and the first solar cell module P-electrodes do not pass through the first solar cell module P-type doping layer;
first solar cell module N-electrodes connected to a first solar cell module N-type doping layer wherein there are no through holes in the first solar cell module N-type doping layer and the first solar cell module N-electrodes do not pass through the first solar cell module N-type doping layer;
and a first solar cell module insulating layer located between the first solar cell N-type and first solar cell P-type electrodes;
characterized in that the first solar cell module electrical connection layer comprises a number of first solar cell module parallel leads extending beyond an edge of the first solar cell module each physically connected to a portion of the first solar cell module P-electrodes or a portion of the first solar cell module N-electrodes with the first solar cell module insulating layer in contact with the first solar cell module P-type electrodes and the first solar cell module N-type electrodes and at least partially encompassing the first solar cell module parallel leads physically connected to the first solar cell module P-electrodes, and the first solar cell module parallel leads physically connected to the first solar cell module N-electrodes;
with the second solar cell module comprising second solar cell module cells, a second solar cell module electrical connection layer, a second solar cell module backlight side of the second solar cell module cells having
second solar cell module P-electrodes connected to a second solar cell module P-type doping layer wherein there are no through holes in the second solar cell module P-type doping layer and the second solar cell module P-electrodes do not pass through the second solar cell module P-type doping layer, second solar cell module N-electrodes connected to a second solar cell module N-type doping layer wherein there are no through holes in the second solar cell module N-type doping layer and the second solar cell module N-electrodes do not pass through the second solar cell module N-type doping layer, and a second solar cell module insulating layer located between the second solar cell N-type and second solar cell P-type electrodes;

wherein each first solar cell module parallel lead physically connected to a portion of the first solar cell module P electrodes is physically connected to a portion of the second solar cell module N-electrodes, or each first solar cell module parallel lead physically connected to a portion of the first cell N-electrodes is physically connected to a portion of the second solar cell module P-electrodes with the second solar cell module insulating layer in contact with the second solar cell module P-type electrodes and the second solar cell module N-type electrodes and at least partially encompassing the first solar cell module parallel leads physically connected to the first solar cell module P-electrodes, and the first solar cell module parallel leads physically connected to the first solar cell module N-electrodes.

2. The back-contact solar cell assembly according to claim 1, characterized in that the first solar cell module P-electrodes are dotted P-electrodes or linear P-electrodes, and the first solar cell module N-electrodes are dotted N-electrodes or linear N-electrodes.

3. The back-contact solar cell assembly according to claim 2, characterized in that the diameter of the first solar cell module dotted P-electrodes is 0.4 mm to 1.5 mm, the distance between two adjacent first solar cell module dotted P-electrodes connected to a same one of the first solar cell module parallel leads is 0.7 mm to 10 mm, and the width of the first solar cell module linear P-electrodes is 0.4 mm to 1.5 mm; and the diameter of the first solar cell module dotted N-electrodes is 0.4 mm to 1.5 mm, the distance between two adjacent dotted N-electrodes connected to a same one of the first solar cell module parallel leads is 0.7 mm to 10 mm, and the width of the first solar cell module linear N-electrodes is 0.4 mm to 1.5 mm.

4. The back-contact solar cell assembly according to claim 2, characterized in that the total number of the first solar cell module dotted P-electrodes and the first solar cell module dotted N-electrodes is 1000 to 40000.

5. The back-contact solar cell assembly according to claim 2, characterized in that the first solar cell module dotted electrodes or first solar cell module linear electrodes are made of any one of silver paste, conductive adhesive, conductive polymeric material or tin solder.

6. The back-contact solar cell assembly according to claim 1, characterized in that the distance between a first solar cell module lead connected to the first solar cell module P-electrodes and a first solar cell module lead connected to the first solar cell module N-electrodes is 0.1 mm to 20 mm.

7. The back-contact solar cell assembly according to claim 1, characterized in that the first solar cell module parallel leads are made of any one or more of copper, aluminum, steel, copper clad aluminum or copper clad steel; the cross-section of the first solar cell module parallel leads are any one or more of a circular shape, a square shape or an elliptical shape; and the diameter of a circumcircle of the cross-section shape of the first solar cell module parallel leads are 0.05 mm to 1.5 mm.

8. The back-contact solar cell assembly according to claim 1, characterized in that the surface of the first solar cell module parallel leads are plated with anti-oxidation plating material or coated with a conductive adhesive.

9. The back-contact solar cell assembly according to claim 8, characterized in that the anti-oxidation plating material is any one of tin, tin-lead alloy, tin-bismuth alloy or tin-lead-silver alloy; and the thickness of the plating layer or conductive adhesive layer of the lead 5 μm to 50 μm.

10. The back-contact solar cell-assembly according to claim 8, characterized in that the conductive adhesive is a low-resistivity conductive adhesive that uses a conductive particle and a polymeric binder as main components.

11. The back-contact solar cell assembly according to claim 10, characterized in that the conductive particle in the conductive adhesive is any one or more of gold, silver, copper, god-plated nickel, silver-plated nickel and silver-plated copper; and the shape of the conductive particle is any one or more of a spherical shape, a flake shape, an olivary shape and an acicular shape; and the particle size of the conductive particle is 0.01 μm to 5 μm.

12. The back-contact solar cell assembly according to claim 10, characterized in that the polymeric binder in the conductive adhesive is any one of or a combination of two of epoxy resin, polyurethane resin, acrylic resin or organic silicone resin, and the binder is thermosetting or photocureable.

13. The back-contact solar cell assembly according to claim 1, characterized in that the number of the first solar cell module parallel leads are 10 to 500.

14. The back-contact solar cell assembly according to claim 1, characterized in that the first solar cell module electrical connection layer is provided with first solar cell module P-busbar electrodes and first solar cell module N-busbar electrodes, which are arranged on two sides of the first solar cell module electrical connection layer.

15. The back-contact solar cell assembly according to claim 14, characterized in that the surface of the first solar cell module busbar electrodes has a concave-convex shape.

16. The back-contact solar cell assembly according to claim 1, characterized in that a thermoplastic resin or thermosetting resin is provided at an insulating layer between the first solar cell module P-electrodes and the first solar cell module N-electrodes.

17. The back-contact solar cell assembly according to claim 16, characterized in that the thermoplastic resin or the thermosetting resin is any one of or a combination of two of ethylene-vinyl acetate copolymer, polyolefin resin, epoxy resin, polyurethane resin, acrylic resin and organic silicon resin.

18. A back-contact solar cell assembly comprising fronting material, packaging material, a solar cell layer, packaging material and backing material, which are connected from top to bottom, characterized in that the solar cell layer comprises a number of solar cell modules the solar cell module refers to the solar cell module according to any one of claims 1-17, and the adjacent ones of the solar cell modules are electrically connected via busbars located on two sides of an electrical connection layer.

19. The back-contact solar cell assembly according to claim 18, characterized in that solar cells in each of the solar cell modules are connected in series to each other; and the solar cell modules are successively connected in series to each other, and the number of solar cells in each of the solar cell modules is the same.

20. The back-contact solar cell assembly according to claim 18, characterized in that each of the solar cell modules comprises 1 to 120 cells.

21. The back-contact solar cell assembly according to claim 18, characterized in that the busbars are connected by a conductive medium.

22. The back-contact solar cell assembly according to claim 21, characterized in that the conductive medium comprises any one of silver paste, conductive adhesive or tin solder.

* * * * *